United States Patent
He et al.

(10) Patent No.: US 11,980,101 B2
(45) Date of Patent: May 7, 2024

(54) THERMOELECTRIC DEVICE AND MANUFACTURING MOLD AND MANUFACTURING METHOD THEREFOR

(71) Applicant: XI'AN JIAOTONG UNIVERSITY, Shaanxi (CN)

(72) Inventors: Hailong He, Shaanxi (CN); Chunping Niu, Shaanxi (CN); Hongrui Ren, Shaanxi (CN); Yi Wu, Shaanxi (CN); Mingzhe Rong, Shaanxi (CN)

(73) Assignee: XI'AN JIAOTONG UNIVERSITY, Xi'an (CN)

( * ) Notice: Subject to any disclaimer, the term of this patent is extended or adjusted under 35 U.S.C. 154(b) by 0 days.

(21) Appl. No.: 17/858,829

(22) Filed: Jul. 6, 2022

(65) Prior Publication Data

US 2023/0010940 A1    Jan. 12, 2023

(30) Foreign Application Priority Data

Jul. 7, 2021  (CN) .......................... 202110770987.5

(51) Int. Cl.
*H10N 10/854* (2023.01)
*H10N 10/17* (2023.01)
*H10N 10/81* (2023.01)

(52) U.S. Cl.
CPC .......... *H10N 10/854* (2023.02); *H10N 10/17* (2023.02); *H10N 10/81* (2023.02)

(58) Field of Classification Search
None
See application file for complete search history.

(56) References Cited

U.S. PATENT DOCUMENTS

2013/0014796 A1* 1/2013 Tajima ................... H10N 10/17
                                                               136/203
2013/0152990 A1* 6/2013 Lai ......................... B23K 20/24
                                                               228/256

(Continued)

FOREIGN PATENT DOCUMENTS

KR        20210027858 A * 1/2006 ............. H01L 35/32

OTHER PUBLICATIONS

Huntsman, "Epoxy curing Agent Types and Applications", https://www.gabrielchem.com/huntsman-products-faq/epoxy-curing-agent-types-and-applications/#:~:text=Epoxy%20resin%20systems%20consist%20of,results%20in%20hard%2C%20thermoset%20materials, All Pages, 2019. (Year: 2019).*

(Continued)

*Primary Examiner* — Daniel P Malley, Jr.

(57) ABSTRACT

Disclosed are a thermoelectric device and a manufacturing mold and manufacturing method thereof. The thermoelectric device includes at least one set of thermoelectric arm unit, wherein a first thermoelectric arm is provided with a first upper surface and a first lower surface opposite to the first upper surface; a second thermoelectric arm is provided with a second upper surface and a second lower surface opposite to the second upper surface; the second thermoelectric arm is seamlessly bonded with the first thermoelectric arm via an insulating adhesive layer; the first upper surface is flush with the second upper surface, and a first spacing groove is formed between adjacent positions of the first upper surface and the second upper surface; the first lower surface is flush with the second lower surface, and a second spacing groove is formed between adjacent positions of the first lower surface and the second lower surface.

13 Claims, 5 Drawing Sheets

(56) References Cited

U.S. PATENT DOCUMENTS

| | | | |
|---|---|---|---|
| 2014/0190542 A1* | 7/2014 | Lane | H10N 19/00 |
| | | | 136/212 |
| 2018/0219148 A1* | 8/2018 | Sung | H10N 10/852 |
| 2022/0069190 A1* | 3/2022 | Kim | H10N 10/81 |

OTHER PUBLICATIONS

English machine translation of Lee (KR20210027858A) provided by the EPO website, All Page, 2023. (Year: 2023).*
Sisik et al., "The Influence of Leg Shape on Thermoelectric Performance Under Constant Temperature and Heat Flux Boundary Conditions", Frontiers in Materials, vol. 7, All Pages, 2020. (Year: 2020).*

* cited by examiner

THERMOELECTRIC DEVICE AND MANUFACTURING MOLD AND MANUFACTURING METHOD THEREFOR

CROSS-REFERENCE TO RELATED PATENT APPLICATION

This application claims priority to and the benefit of the Chinese Patent Application Serial No. 202110770987.5, filed Jul. 7, 2021, in the China National Intellectual Property Administration (CNIPA), which is expressly incorporated by reference herein in its entirety.

Some references, which may include patents, patent applications, and various publications, are cited and discussed in the description of the present disclosure. The citation and/or discussion of such references is provided merely to clarify the description of the present disclosure and is not an admission that any such reference is "prior art" to the present disclosure described herein. All references cited and discussed in this specification are incorporated herein by reference in their entireties and to the same extent as if each reference is individually incorporated by reference.

TECHNICAL FIELD

The present disclosure relates to the technical field of thermoelectric materials and devices, in particular to a thermoelectric device and a manufacturing mold and manufacturing method therefor.

BACKGROUND

In recent years, increasing energy consumption and increasingly serious environmental problems have attracted widespread attention. In order to cope with the upcoming energy crisis, it is of great significance to explore sustainable and eco-friendly energy. A thermoelectric power generation technology based on direct energy conversion between heat energy and electric energy is considered as a promising alternative method for solving the global energy dilemma, and has the advantages of no pollution, no noise, no maintenance and the like. The design of a thermoelectric device is a key link in the research process of the thermoelectric power generation technology, and the improvement of the output performance of the thermoelectric device by means of the improvement of the structure of the thermoelectric device is very important.

The thermoelectric device is formed by connecting a plurality of π-type thermoelectric pairs in series, the basic constituent unit of the thermoelectric device is a π-type thermoelectric pair, and the π-type thermoelectric pair includes a pair of n-type thermoelectric arm and p-type thermoelectric arm which are arranged in parallel, a high-temperature-end flow deflector and a low-temperature-end flow deflector, and a low temperature end is used as an electrode which is led out. In order to ensure insulation between the thermoelectric pair, an air gap needs to be reserved between the thermoelectric arms in a conventional thermoelectric device, and the filling factor of the thermoelectric device is defined as the ratio of the sum of the cross sectional areas of the thermoelectric arms facing electrodes to the area of the basic area of the device, and at present, the filling factor of commercial devices is between 25% and 50%. The air gaps cause the following problems: firstly, a large amount of space in the device cannot be effectively utilized, and the power density of the device is low, so that miniaturization is not facilitated; secondly, partial heat flow transmitted from a heat source to the device is partially dissipated from the air of the device and is not effectively utilized, so that the output power and the power density of the device are further reduced; thirdly, the air gaps influence the overall structural strength of the device, and in order to ensure the mechanical strength of the conventional device, the flow deflectors need to be fixed to an insulating ceramic heat-conducting sheet, but a contact interface is introduced by the existence of the insulating ceramic heat-conducting sheet, so that the contact heat resistance is increased, meanwhile, the insulating ceramic heat-conducting sheet has larger thickness, heat resistance is generated, and improvement of the output performance of the device is hindered.

The above information disclosed in the Background section is only for enhancement of understanding of the background of the present disclosure and therefore information that does not form the prior art that is already known to a person of ordinary skill in the art may be contained.

SUMMARY

The present disclosure aims to provide a thermoelectric device and a manufacturing mold and manufacturing method therefor, compared with an existing thermoelectric device, the thermoelectric device has the advantages that air gaps and a ceramic heat-conducting sheet can be omitted, the overall structural strength and stress intensity are enhanced, heat flow loss is reduced, high-temperature-end heat transfer and low-temperature-end cooling effects are enhanced, and the efficiency and power density of the device are improved.

In order to achieve the purpose, the present disclosure provides the following technical solutions:

a thermoelectric device of the present disclosure includes at least one set of thermoelectric arm unit, wherein the thermoelectric arm unit includes:

a first thermoelectric arm, provided with a first upper surface and a first lower surface opposite to the first upper surface, a second thermoelectric arm, provided with a second upper surface and a second lower surface opposite to the second upper surface, wherein the second thermoelectric arm is seamlessly bonded with the first thermoelectric arm via an insulating adhesive layer, the first upper surface is flush with the second upper surface, a first spacing groove is formed between adjacent positions of the first upper surface and the second upper surface, the first lower surface is flush with the second lower surface, and a second spacing groove is formed between adjacent positions of the first lower surface and the second lower surface, a first upper barrier layer, laminated on the first upper surface, a second upper barrier layer, laminated on the second upper surface, an upper flow deflector, laminated on the first upper barrier layer and the second upper barrier layer, a first lower barrier layer, laminated on the first lower surface, a second lower barrier layer, laminated on the second lower surface, a first lower flow deflector, laminated on the first lower barrier layer, and a second lower flow deflector, laminated on the second lower barrier layer.

In the thermoelectric device, an upper heat-conducting insulating layer is laminated on the upper flow deflector, a first lower heat-conducting insulating layer is laminated on the bottom face of the first lower flow deflector, and a second lower heat-conducting insulating layer is laminated on the bottom face of the second lower flow deflector.

In the thermoelectric device, the upper flow deflector is in direct contact with a cooling apparatus and the first lower flow deflector and the second lower flow deflector are both in direct contact with a heat source, or the upper flow deflector is in direct contact with the heat source and the first lower flow deflector and the second lower flow deflector are both in direct contact with the cooling apparatus.

In the thermoelectric device, the thermoelectric arm unit is symmetric about the insulating adhesive layer.

In the thermoelectric device, the insulating adhesive layer includes epoxy AB glue; the first thermoelectric arm is a p-type thermoelectric piece and the second thermoelectric arm is an n-type thermoelectric piece, or the first thermoelectric arm is an n-type thermoelectric piece and the second thermoelectric arm is a p-type thermoelectric piece.

In the thermoelectric device, the lengths and widths of the first thermoelectric arm and the second thermoelectric arm are both equal and are 2.5-6 mm, the heights of the first thermoelectric arm and the second thermoelectric arm are both 2.5-10 mm, the depths of the first spacing groove and the second spacing groove are both 0.3-0.5 mm, and the widths of the first spacing groove and the second spacing groove are both 0.35-0.7 mm.

In the thermoelectric device, the upper flow deflector, the first lower flow deflector and/or the second lower flow deflector are copper sheets with the thicknesses of 0.2-1 mm, and the copper sheet is plated with a silver layer of the thickness of 1-5 μm.

In the thermoelectric device, the first upper barrier layer, the first lower barrier layer, the second upper barrier layer and/or the second lower barrier layer are nickel layers with the thicknesses of 1-5 μm.

A manufacturing mold for manufacturing the thermoelectric device includes:
- a bottom plate, provided with a horizontal supporting surface, wherein a plurality of first positioning holes are formed in the periphery of the supporting surface,
- a lower substrate, supported on the supporting surface, wherein the lower substrate is provided with equally spaced lower electrode positioning grooves to position the first lower flow deflector and/or the second lower flow deflector, a through hole is formed in the center of the lower electrode positioning groove, and a plurality of second positioning holes aligned to the first positioning holes are formed in the periphery of the lower substrate,
- a thermoelectric positioning frame, supported on the lower substrate, wherein the thermoelectric positioning frame includes a hollow portion arranged in the center and used for positioning the first thermoelectric arm with the first upper barrier layer and the first lower barrier layer and/or the second thermoelectric arm with the second upper barrier layer and the second lower barrier layer, and a plurality of third positioning holes formed in the periphery and aligned to the second positioning holes,
- an upper substrate, supported on the thermoelectric arm positioning frame, wherein the upper substrate is provided with equally spaced upper electrode positioning grooves to position the upper flow deflector, a through hole is formed in the center of the upper electrode positioning groove, a plurality of fourth positioning holes aligned to the third positioning holes are formed in the periphery of the upper substrate, and the upper electrode positioning grooves cooperate with the lower electrode positioning grooves to be connect the thermoelectric arm units in series,
- a lower top plate, supported on the upper substrate, wherein the lower top plate includes a lower mounting groove formed in the middle and used for a spring to be embedded therein, and a plurality of fifth positioning holes formed in the periphery and aligned to the fourth positioning holes, and
- an upper top plate, supported on the lower top plate, wherein the upper top plate includes an upper mounting groove formed in the middle and used for the spring to be embedded therein, and a plurality of sixth positioning holes formed in the periphery and aligned to the fifth positioning holes, the upper mounting groove cooperates with the lower mounting groove to position the spring, and the first positioning holes, the second positioning holes, the third positioning holes, the fourth positioning holes, the fifth positioning holes and the sixth positioning holes are connected via fasteners.

A manufacturing method for manufacturing the thermoelectric device by using the manufacturing mold includes the following steps:
- carrying out wire-electrode cutting on an n-type bismuth telluride sample and a p-type bismuth telluride sample to obtain thermoelectric sheets, and bonding the thermoelectric sheets via an insulating adhesive layer to obtain the first thermoelectric arm and the second thermoelectric arm which are seamlessly connected,
- carrying out magnetron sputtering, electroplating or ionic spraying on the first thermoelectric arm and the second thermoelectric arm to form the first upper barrier layer and first lower barrier layer on the first thermoelectric arm, and form the second upper barrier layer and the second lower barrier layer on the second thermoelectric arm,
- carrying out wire-electrode cutting on the first thermoelectric arm and the second thermoelectric arm to form the first spacing groove and the second spacing groove, and
- placing the upper flow deflector into the upper electrode positioning grooves, placing the first lower flow deflector and the second lower flow deflector into the lower electrode positioning grooves, carrying out silk screen printing on the upper flow deflector, the first lower flow deflector and the second lower flow deflector with solder paste separately, positioning the first thermoelectric arm and the second thermoelectric arm by using the thermoelectric arm positioning frame, connecting the first positioning holes, the second positioning holes, the third positioning holes, the fourth positioning holes, the fifth positioning holes and the sixth positioning holes via the fasteners to assemble the manufacturing mold, and placing the manufacturing mold into a reflow oven for heating welding to form the thermoelectric device.

In the above technical solutions, the thermoelectric device and the manufacturing mold and manufacturing method therefor provided by the present disclosure have the following beneficial effects: a thermoelectric-arm-abutting-type structure is utilized, and overall structural strength and stress strength are increased by means of omitting air gaps; by means of omitting a heat-conducting ceramic wafer with a structure supporting effect, a high-temperature-end flow deflector is in direct contact with the heat source, a low-temperature-end flow deflector is in direct contact with the cooling apparatus, heat resistance is reduced, high-temperature-end heat transfer and low-temperature-end cooling effects are enhanced, meanwhile, the air gaps do not exist, thus, heat flow loss through air is avoided, and the efficiency of the device is improved; and the device is compact in structure, power output similar to that of a conventional thermoelectric device is realized on smaller area, and the power density of the device is increased.

BRIEF DESCRIPTION OF THE DRAWINGS

In order to more clearly illustrate the embodiments of the present application or technical solutions in the prior art, the drawings required in the embodiments will be briefly described below, it is obvious that the drawings in the following description are only some embodiments described in the present disclosure, and other drawings can be obtained by those skilled in the art according to these drawings.

DETAILED DESCRIPTION

Figure 1:
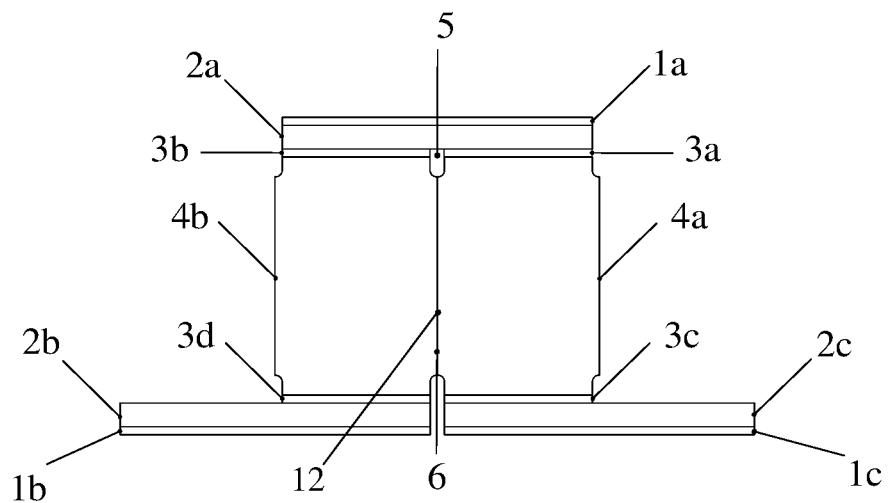
FIG. 1 is a structural schematic diagram of a thermoelectric arm unit of a thermoelectric device.
Figure 2:
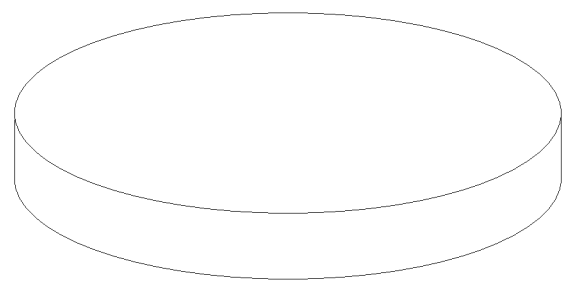
FIG. 2 is a structural schematic diagram of a thermoelectric sheet of a thermoelectric device.
Figure 3:
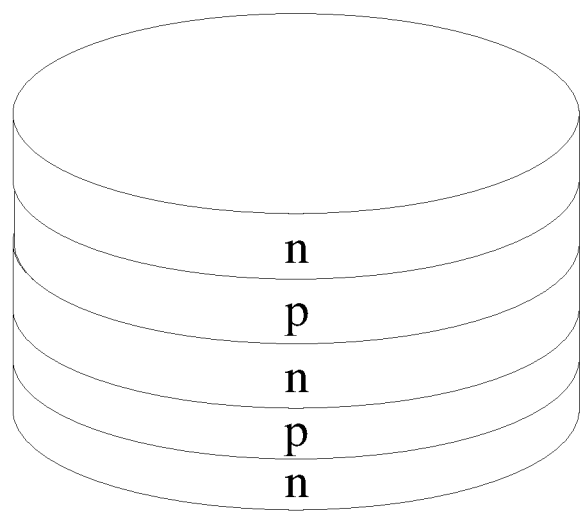
FIG. 3 is a structural schematic diagram of bonded thermoelectric sheets of a thermoelectric device.
Figure 4:
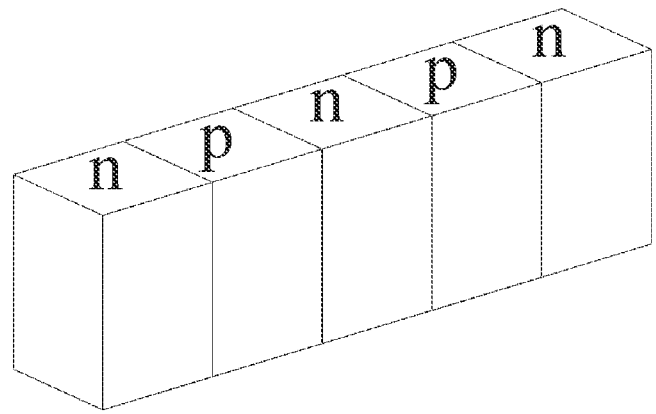
FIG. 4 is a three-dimensional diagram of a thermoelectric strip of a thermoelectric device.
Figure 5:
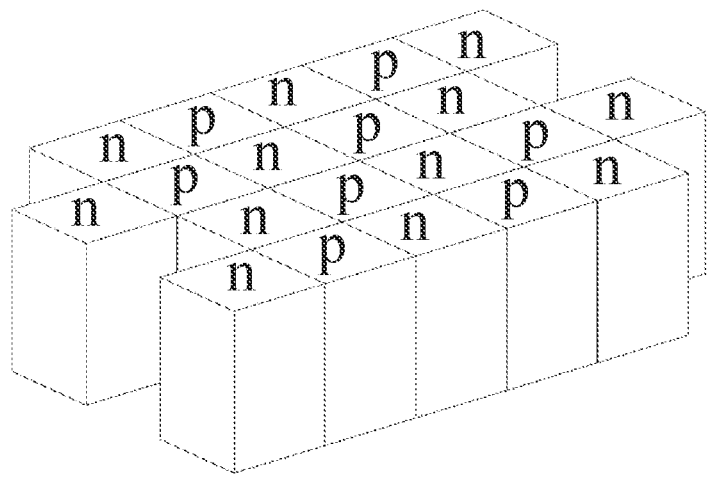
FIG. 5 is a three-dimensional diagram of a thermoelectric strip bonding structure of the present disclosure.
Figure 6:
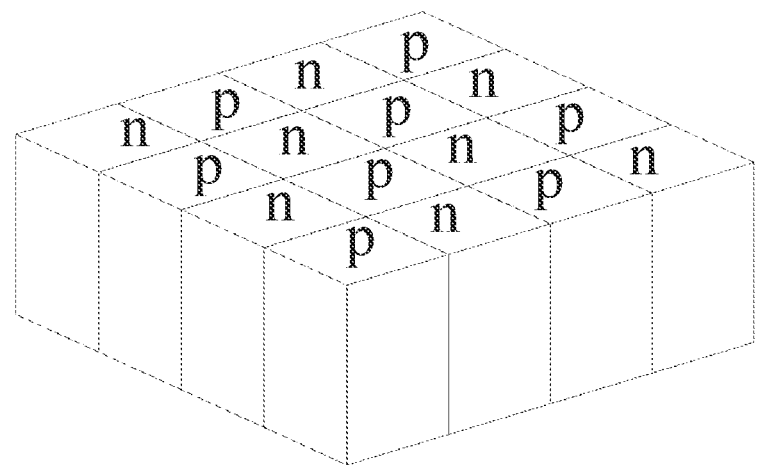
FIG. 6 is a three-dimensional diagram of a thermoelectric arm of the present disclosure.
Figure 7:
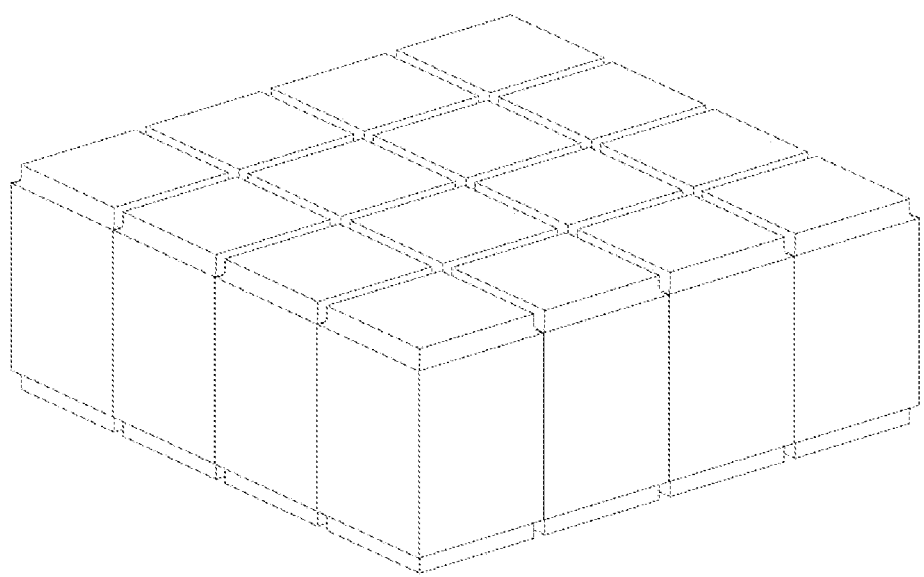
FIG. 7 is a three-dimensional diagram of a structure obtained after surfaces of thermoelectric arms are grooved for insulation according to the present disclosure.
Figure 8:
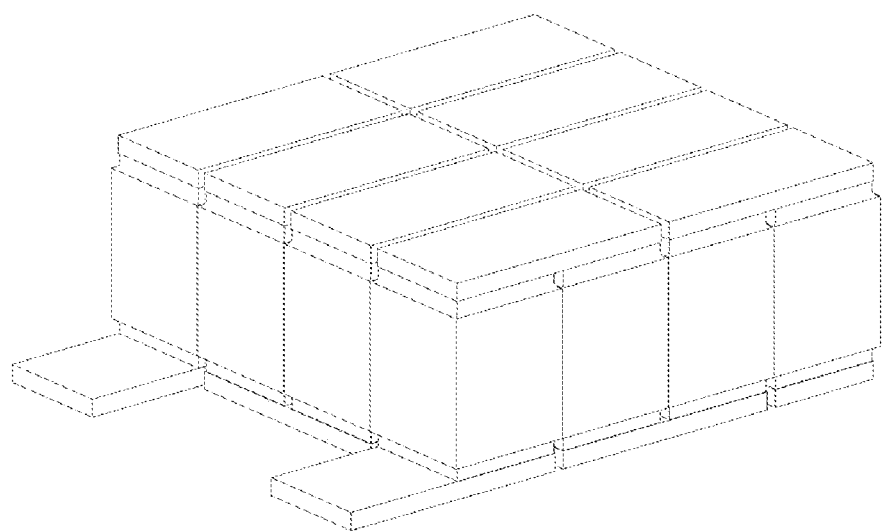
FIG. 8 is a three-dimensional diagram of a thermoelectric device of the present disclosure.

In order to make the objects, technical solutions and advantages of the embodiments of the present disclosure clearer, the technical solutions of the embodiments of the present disclosure will be clearly and completely described below with reference to FIG. 1 to FIG. 9 of the embodiments of the present disclosure, and it is obvious that the described embodiments are only a few, but not all embodiments of the present disclosure. All other embodiments, which can be obtained by a person skilled in the art without inventive efforts based on the embodiments of the present disclosure, are within the scope of protection of the present disclosure.

Thus, the following detailed description of the embodiments of the present disclosure, as presented in the drawings, is not intended to limit the scope of the present disclosure, as claimed, but is merely representative of selected embodiments of the present disclosure. All other embodiments, which can be obtained by a person skilled in the art without inventive efforts based on the embodiments of the present disclosure, are within the scope of protection of the present disclosure.

It should be noted that like reference signs and letters refer to like items in the following drawings, and thus, once an item is defined in one drawing, it needs not be further defined or explained in subsequent drawings.

In the description of the present disclosure, it is to be understood that the terms "center", "longitudinal", "lateral", "length", "width", "thickness", "upper", "lower", "front", "rear", "left", "right", "vertical", "horizontal", "top", "bottom", "inner", "outer", "clockwise", "counterclockwise", and the like, indicate orientations or positional relationships based on those shown in the drawings, merely for convenience of description and simplicity of description, and do not indicate or imply that the device or element so referred to must have a particular orientation, be constructed in a particular orientation, and be operated, and thus, are not to be construed as limiting the present disclosure.

Furthermore, the terms "first" and "second" are used for descriptive purposes only and are not to be construed as indicating or implying relative importance or to implicitly indicate the number of technical features indicated. Thus, a feature defined with "first" or "second" may explicitly or implicitly include one or more of the features. In the description of the present disclosure, "plurality of" means two or more unless specifically defined otherwise.

In the present disclosure, unless otherwise explicitly stated or limited, the terms "mounting," "connected", "connection," "fixing," and the like should be understood broadly, for example, connection may be fixed connection, detachable connection, or integrated connection; connection may be direct connection or indirect connection through an intermediate medium, or connection may be the internal communication of two elements or the interaction of two elements. The specific meanings of the above terms in the present disclosure can be understood according to specific situations by those of ordinary skill in the art.

In the present disclosure, unless expressly stated or limited otherwise, a first feature "above" or "below" a second feature may include that the first feature and the second feature are in direct contact, and may also include that the first feature and the second feature are not in direct contact, but are in contact via another feature between the first feature and the second feature. Also, the first feature being "on," "above" and "over" the second feature may include the first feature being directly above and obliquely above the second feature, or simply indicating that the level of the first feature is higher than that of the second feature. The first feature being "under," "below" and "beneath" the second feature may include the first feature being directly below and obliquely below the second feature, or simply indicating that the level of the first feature is lower than that of the second feature.

In order to enable those skilled in the art to better understand the technical solutions of the present disclosure, the present disclosure will be further described in detail with reference to the accompanying drawings.

In an embodiment, as shown in FIG. 1 to FIG. 8, a thermoelectric device includes at least one set of thermoelectric arm unit, the thermoelectric arm unit includes:

a first thermoelectric arm 4b, provided with a first upper surface and a first lower surface opposite to the first upper surface, a second thermoelectric arm 4a, provided with a second upper surface and a second lower surface opposite to the second upper surface, wherein the second thermoelectric arm 4a is seamlessly bonded with the first thermoelectric arm 4b via an insulating adhesive layer 12, the first upper surface is flush with the second upper surface, a first spacing groove 5 is formed between adjacent positions of the first upper surface and the second upper surface, the first lower surface is flush with the second lower surface, and a second spacing groove 6 is formed between adjacent positions of the first lower surface and the second lower surface, a first upper barrier layer 3b, laminated on the first upper surface, a second upper barrier layer 3a, laminated on the second upper surface, an upper flow deflector 2a, laminated on the first upper barrier layer 3b and the second upper barrier layer 3a, a first lower barrier layer 3d, laminated on the first lower surface, a second lower barrier layer 3c, laminated on the second lower surface, a first lower flow deflector 2b, laminated on the first lower barrier layer 3d, and a second lower flow deflector 2c, laminated on the second lower barrier layer 3c.

The present disclosure a thermoelectric device which replaces a ceramic heat-conducting plate, and which is arranged on the outer surfaces of flow deflectors; series connection of the thermoelectric arms is achieved by the flow deflectors at cold and hot ends; the barrier layers are arranged at the two ends, which are in contact with electrodes, of the thermoelectric arms; and the thermoelectric arms abut against together, and side faces of the thermoelectric arms are bonded with each other by means of high-temperature-resistant insulating adhesive 12, so that air gaps in the thermoelectric device are omitted. According to the thermoelectric device provided by the present disclosure, the air gaps and the ceramic heat-conducting sheet with a structure supporting effect are omitted, and the overall structural strength and stress strength are improved; heat resistance is reduced, and high-temperature-end heat transfer and low-temperature-end cooling effects are enhanced; heat flow loss caused by heat transfer through air gaps is avoided, and the efficiency of the device is improved; and the structure is compact, power output similar to that of a traditional thermoelectric device is achieved on smaller area, and power density is improved.

In a preferred embodiment of the thermoelectric device, an upper heat-conducting insulating layer 1a is laminated on the upper flow deflector 2a, a first lower heat-conducting insulating layer 1b is laminated on the bottom face of the first lower flow deflector 2b, and a second lower heat-conducting insulating layer 1c is laminated on the bottom face of the second lower flow deflector 2c.

In a preferred embodiment of the thermoelectric device, the upper flow deflector 2a is in direct contact with a cooling apparatus, and the first lower flow deflector 2b and the second lower flow deflector 2c are both in direct contact with the heat source, or the upper flow deflector 2a is in direct contact with the heat source, and the first lower flow deflector 2b and the second lower flow deflector 2c are both in direct contact with the cooling apparatus.

In a preferred embodiment of the thermoelectric device, components of the thermoelectric arm unit are symmetric about the insulating adhesive layer 12.

In a preferred embodiment of the thermoelectric device, the insulating adhesive layer 12 includes epoxy AB glue; and the first thermoelectric arm 4b is a p-type thermoelectric piece, and the second thermoelectric arm 4a is an n-type thermoelectric piece, or the first thermoelectric arm 4b is an n-type thermoelectric piece, and the second thermoelectric arm 4a is a p-type thermoelectric piece.

In a preferred embodiment of the thermoelectric device, the lengths and widths of the first thermoelectric arm 4b and the second thermoelectric arm 4a are both equal and are 2.5-6 mm, the heights of the first thermoelectric arm 4b and the second thermoelectric arm 4a are both 2.5-10 mm, the depths of the first spacing groove 5 and the second spacing groove 6 are both 0.3-0.5 mm, and the widths of the first spacing groove 5 and the second spacing groove 6 are both 0.35-0.7 mm.

In a preferred embodiment of the thermoelectric device, the upper flow deflector 2a, the first lower flow deflector 2b and/or the second lower flow deflector 2c are copper sheets with the thicknesses of 0.2-1 mm, and each copper sheet is plated with a silver layer with the thickness of 1-5 μm.

In a preferred embodiment of the thermoelectric device, the first upper barrier layer 3b, the first lower barrier layer 3d, the second upper barrier layer 3a and/or the second lower barrier layer 3c are nickel layers with the thicknesses of 1-5 μm.

In an embodiment, the thermoelectric device includes a heat-conducting insulating layer, flow deflectors at cold and hot ends, barrier layers and thermoelectric arms. The thermoelectric arms abut against together without an air gap existing therebetween, and therefore, the thermoelectric device is called a thermoelectric-arm-abutting-type thermoelectric device. By utilizing an abutting-type thermoelectric arm structure, the overall structural strength and stress strength of the device are improved by means of omitting the air gaps; by means of omitting a ceramic heat-conducting sheet with a structure supporting effect, a high-temperature-end flow deflector is in direct contact with a heat source, a low-temperature-end flow deflector is in direct contact with a cooling apparatus, heat resistance is reduced, high-temperature-end heat transfer and low-temperature-end cooling effects are enhanced, meanwhile, heat flow loss caused by heat transfer through air gaps is avoided, and the efficiency of the device is improved; and the device is compact in structure, power output similar to that of a conventional thermoelectric device is realized on smaller area, and the power density of the device is improved.

In an embodiment, the first thermoelectric arm 4b and the second thermoelectric arm 4a are bonded with each other by means of high-temperature-resistant epoxy AB glue with low heat conductivity, electric insulation between the thermoelectric arms is realized, and heat conduction between the thermoelectric arms is relieved to reduce adverse influences of omission of air gaps on output of the device.

In an embodiment, the first upper barrier layer 3b, the first lower barrier layer 3d, the second upper barrier layer 3a and/or the second lower barrier layer 3c are nickel layers with a thickness of 1-5 μm, the barrier layers are used for stopping solder from entering the thermoelectric arms, influences of the solder on the performance of a thermoelectric material are avoided, and meanwhile, welding of the thermoelectric arms and electrodes is facilitated.

In an embodiment, a first spacing groove 5 of which the depth is 0.3-0.5 mm and the width is 0.35-0.7 mm is cut at a connection gap in the surfaces of the abutting-type thermoelectric arms by wire-electrode cutting, so as to achieve insulation between surfaces of the different thermoelectric arms, and meanwhile, short-circuiting caused during welding is avoided. In addition, by smaller depth and width of the groove, influences of loss of a thermoelectric arm material on the output performance of the device can be reduced as much as possible.

In an embodiment, the flow deflectors at cold and hot ends are copper sheets, the thickness of each copper sheet is 0.2-1 mm, each copper sheet is plated with silver with a thickness of 1-5 μm, the cost is considered, the electrical conductivity and the heat conductivity are improved, and meanwhile, welding is facilitated.

In an embodiment, a heat-conducting insulating layer may be made of heat-conducting silica gel, while an insulating function is fulfilled, good heat conductivity is guaranteed, and meanwhile, good connection between the device and the heat source and good connection between the device and the cooling apparatus are achieved. The heat-conducting insulating layer is used for replacing a ceramic plate of a conventional device, insulation of the surfaces of the flow deflectors of the thermoelectric device is achieved, meanwhile, good heat conductivity is achieved, and heat resistance is reduced.

Figure 9:
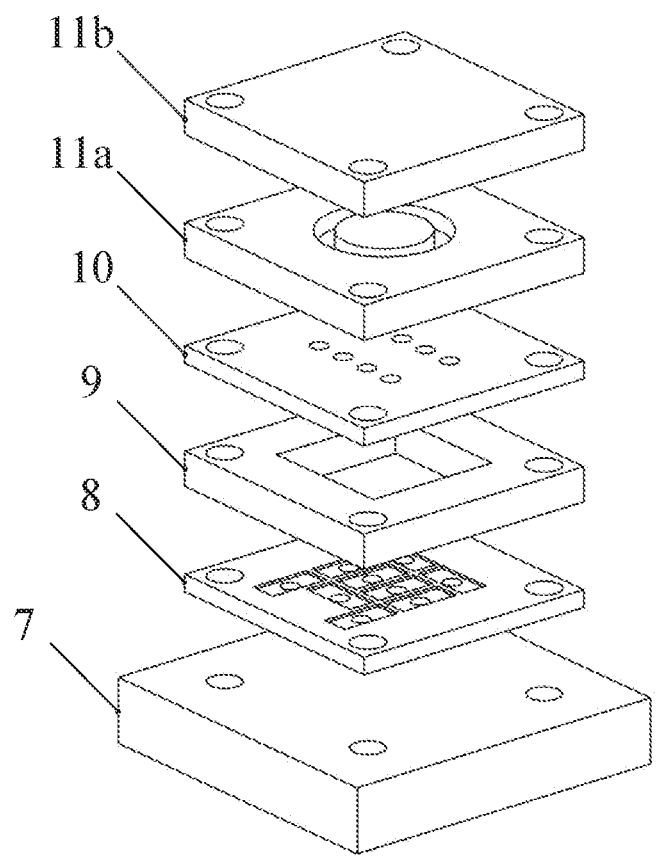
FIG. 9 is a three-dimensional diagram of a manufacturing mold of the present disclosure.

As shown in FIG. 9, a manufacturing mold for manufacturing the thermoelectric device includes:

a bottom plate 7, provided with a horizontal supporting surface, wherein a plurality of first positioning holes are formed in the periphery of the supporting surface, a lower substrate 8, supported on the supporting surface, wherein the lower substrate 8 is provided with equally spaced lower electrode positioning grooves to position the first lower flow deflector 2b and/or the second lower flow deflector 2c, a through hole is formed in the center of each lower electrode positioning groove, and a plurality of second positioning holes aligned to the first positioning holes are formed in the periphery of the lower substrate 8, a thermoelectric arm positioning frame 9, supported on the lower substrate 8, wherein the thermoelectric arm positioning frame 9 includes a hollow portion arranged in the center and used for positioning the first thermoelectric arm 4b with the first upper barrier layer 3b and the first lower barrier layer 3d and/or the second thermoelectric arm 4a with the second upper barrier layer 3a and the second lower barrier layer 3c, and a plurality of third positioning holes formed in the periphery and aligned to the second positioning holes, an upper substrate 10, supported on the thermoelectric arm positioning frame 9, wherein the upper substrate 10 is provided with equally spaced upper electrode positioning grooves to position the upper flow deflector 2a, a through hole is formed in the center of each upper electrode positioning groove, a plurality of fourth positioning holes aligned to the third positioning holes are formed in the periphery of the upper substrate 10, and the upper electrode positioning grooves cooperate with the lower electrode positioning grooves to connect the thermoelectric arm unit in series, a lower top plate 11a, supported on the upper substrate 10, wherein the lower top plate 11a includes a lower mounting groove formed in the middle and used for a spring to be embedded therein, and a plurality of fifth positioning holes formed in the periphery and aligned to the fourth positioning holes, and an upper top plate 11b, supported on the lower top plate 11a, wherein the upper top plate 11b includes an upper mounting groove formed in the middle and used for the spring to be embedded therein, and a plurality of sixth positioning holes formed in the periphery and aligned to the fifth positioning holes, the upper mounting groove cooperates with the lower mounting groove to position the spring, and the first positioning holes, the second positioning holes, the third positioning holes, the fourth positioning holes, the fifth positioning holes and the sixth positioning holes are connected via fasteners.

In an embodiment, the manufacturing mold consists of 6 parts which respectively include a bottom plate 7, a lower substrate 8, a thermoelectric arm positioning frame 9, an upper substrate 10, a lower top plate 11a and an upper top plate 11b. The used material is stainless steel so as to be used for heating welding. Positioning holes are formed in the periphery of the bottom plate 7, the other face is embedded by a certain depth so that half-thread screw heads are embedded into the mold, flatness of the bottom of the mold is guaranteed, and shaking of screws is avoided. The lower substrate 8 contains positioning holes in the periphery, electrode grooves are deepened at an equally spaced manner, electrodes are embedded into the electrode grooves, a hole is formed in the center of each groove, and thus, the thermoelectric device can be removed conveniently after machining is completed. Positioning holes are formed in the periphery of the thermoelectric arm positioning frame 9, a thermoelectric arm whole body penetrates through the center of the thermoelectric arm positioning frame, so that the bonded thermoelectric arms are placed into the mold to be positioned conveniently, part of the bottom is deepened, and the positions of extra wiring electrodes on the lower substrate 8 are reserved. The structure of the upper substrate 10 is similar to that of the lower substrate 8, and the electrode positioning grooves of the upper substrate 10 cooperate with the electrode positioning grooves of the lower substrate 8 to achieve series connection of the thermoelectric arms. The structure of the lower top plate 11a is the same as that of the upper top plate 11b, positioning holes are formed in the periphery, a circular groove for a spring to be embedded therein is formed in the middle so as to prevent the spring from displacing, and the spring has a function of applying uniform pressure to ensure welding firmness. Positioning and fixing are carried out by half-thread screws, and welding pressure is applied by using the spring to ensure firm welding. The used material is stainless steel so as to be used for heating welding. Positioning holes are formed in the periphery of each constituent part of the mold, and M4 screws pass through the positioning holes for positioning. The thickness of the bottom plate 7 is 9 mm, the aperture size of the other face of each positioning hole is matched with the size of the corresponding half-thread screw head, each positioning hole goes deep into the mold by 4.5 mm to be used for embedding the corresponding half-thread screw head into the mold, flatness of the bottom of the mold is ensured, and shaking of the screws is avoided. The thickness of the lower substrate 8 is 1.5-2 mm, grooves for containing electrodes are machined on the surface of the lower substrate at an equally spaced manner, the depth of each groove is half of the depth of a used electrode, the grooves are used for positioning the electrodes when the device is assembled, a hole is formed in the center of each groove in a penetrating manner, and thus, the device can be taken out conveniently after welding is completed. The thickness of the thermoelectric arm positioning frame 9 is less than the height of the thermoelectric arm by 1-2 mm, a hole is formed in the center of the thermoelectric arm positioning frame 9 in a penetrating manner, the size of the hole is matched with that of bonded thermoelectric arms, the hole is used for positioning the thermoelectric arms, and a space for protruded wiring electrodes of the lower substrate 8 is reserved in the bottom. The thickness of the upper substrate 10 is 1.5-2 mm, the structure of the upper substrate is similar to that of the lower substrate 8, and the electrode positioning grooves of the upper substrate cooperate with the electrode positioning grooves of the lower substrate 8 to achieve series connection of the thermoelectric arms. The structure of the lower top plate 11a is the same as that of the upper top plate 11b, the thickness is 5 mm, a circular groove is machined in the center, the depth is 2.5 mm, the circular groove is used for a spring to be embedded therein to prevent the spring from displacing, and the spring is used for applying uniform pressure to ensure welding firmness.

A manufacturing method for manufacturing the thermoelectric device by using the manufacturing mold includes the following steps:

carrying out wire-electrode cutting on an n-type bismuth telluride sample and a p-type bismuth telluride sample to obtain thermoelectric sheets, and bonding the thermoelectric sheets via an insulating adhesive layer 12 to obtain the first thermoelectric arm 4b and the second thermoelectric arm 4a which are seamlessly connected, carrying out magnetron sputtering, electroplating or ionic spraying on the first thermoelectric arm 4b and the second thermoelectric arm 4a to form the first upper barrier layer 3b and the first lower barrier layer 3d on the first thermoelectric arm and form the second upper barrier layer 3a and the second lower barrier layer 3c on the second thermoelectric arm, carrying out wire-electrode cutting on the first thermoelectric arm 4b and the second thermoelectric arm 4a to form the first spacing groove 5 and the second spacing groove 6, and placing the upper flow deflector 2a into the upper electrode positioning grooves, placing the first lower flow deflector 2b and the second lower flow deflector 2c into the lower electrode positioning grooves, carrying out silk screen printing on the upper flow deflector, the first lower flow deflector and the second lower flow deflector with solder paste separately, positioning the first thermoelectric arm 4b and the second thermoelectric arm 4a by using the thermoelectric arm positioning frame 9, connecting the first positioning holes, the second positioning holes, the third positioning holes, the fourth positioning holes, the fifth positioning holes and the sixth positioning holes via the fasteners to assemble the manufacturing mold, and placing the manufacturing mold into a reflow oven for heating welding to form the thermoelectric device.

In an embodiment, the method includes that:

the n-type bismuth telluride sample and the p-type sample are manufactured by a zone melting method. Thermoelectric sheets are obtained by wire-electrode cutting, and are ultrasonically cleaned in anhydrous ethanol.

The sheets obtained by cutting are bonded by using high-temperature-resistant epoxy AB glue with low heat conductivity, and the sequence is n-p-n . . . -n type or p-n-p . . . -p type.

The bonded thermoelectric sheets are cut into thermoelectric arm strips by wire-electrode cutting. The strips obtained by cutting are bonded in a staggered manner by using the high-temperature-resistant epoxy AB glue with low heat conductivity to obtain a thermoelectric-arm-abutting-type structure. Then redundant thermoelectric arms on two sides are cut off by wire-electrode cutting to obtain thermoelectric arm blocks.

The bonded thermoelectric arm blocks are plated with nickel by means of magnetron sputtering, electroplating or ionic spraying and the like to manufacture the barrier layers.

Gaps of the thermoelectric arm blocks are grooved by wire-electrode cutting to achieve insulation between surfaces of the different thermoelectric arms.

Flow deflectors are manufactured: firstly, copper sheets are obtained by cutting, and then the surfaces of the copper sheets are plated with silver by a chemical method or an electroplating mode.

The flow deflectors are placed into the positioning grooves of the lower substrate 8 and the upper substrate 10 of the mold, and solder paste is printed on the flow deflectors by using a silk screen printing table. The mold is assembled in the order of the bottom plate 7, the lower substrate 8, the thermoelectric arm positioning frame 9 for positioning the thermoelectric arms, the upper substrate 10, the lower top plate 11a, the spring and the upper top plate 11b, and longer M4 half-thread screws pass through the positioning holes for positioning.

The assembled mold is placed into a reflow oven for heating welding, and the thermoelectric device of the present disclosure is obtained after welding is completed.

An n-type bismuth telluride sample and a p-type bismuth telluride sample of which the diameter is 20-30 mm and the length is 50-100 mm are separately manufactured by a zone melting method, and are used for manufacturing the thermoelectric arms in the subsequent steps.

The thermoelectric sheets are obtained by wire-electrode cutting, the thickness corresponds to the lengths and widths of the thermoelectric arms, and is 2.5-6 mm, and the thermoelectric sheets are ultrasonically cleaned in anhydrous ethanol after cutting.

The sheets obtained by cutting are bonded by the high-temperature-resistant epoxy AB glue with low heat conductivity. The 5-15-layer structure of the thermoelectric sheets with the sequence of n-p-n . . . -n type or p-n-p . . . -p type is obtained.

The bonded thermoelectric sheets are cut into thermoelectric arm strips of which the length of the cross section is 2.5-6 mm and the width of the cross section is 2.5-10 mm by wire-electrode cutting. The strips obtained by cutting are bonded in a staggered manner by using the high-temperature-resistant epoxy AB glue with low heat conductivity to obtain a thermoelectric-arm-abutting-type structure. Then the redundant thermoelectric arms on two sides are cut off by wire-electrode cutting to obtain thermoelectric arm blocks.

The bonded thermoelectric arm blocks are plated with nickel by means of magnetron sputtering, electroplating or ionic spraying and the like to manufacture the barrier layers, and the thickness is controlled at 1-5 μm.

Gaps of the thermoelectric arm blocks are grooved by wire-electrode cutting, the width of the grooves is 0.35-0.7 mm, the depth of the grooves is 0.3-0.5 mm, and insulation between surfaces of the different thermoelectric arms is achieved.

The flow deflectors are manufactured: firstly, the copper sheets are obtained by cutting, the length of each copper sheet is smaller than the sum of the lengths of the two thermoelectric arms by 0.3-0.5 mm, the width of each copper sheet is smaller than the width of each thermoelectric arm by 0.3-0.5 mm, and then the surface of each copper sheet is plated with silver by using a chemical method or an electroplating mode.

One face of each flow deflector is bonded by using a high-temperature heat-conducting double sided adhesive tape, the flow detectors are placed into the positioning grooves of the lower substrate 8 and the upper substrate 10, and solder paste of which the thickness is 0.1-0.2 mm and the melting point is 217 degree centigrade is printed on the flow deflectors by using the silk screen printing table. The mold is assembled in the order of the bottom plate 7, the lower substrate 8, the thermoelectric arm positioning frame 9 for positioning the thermoelectric arms, the upper substrate 10, the lower top plate 11a, the spring and the upper top plate 11b, and M4 half-thread screws with the length of 45 mm pass through the positioning holes for positioning.

The assembled mold is placed into a reflow oven for heating welding, the welding temperature is 260 degree centigrade, heating time lasts for 15-25 minutes, and the thermoelectric device of the present disclosure is obtained after welding is completed.

In an embodiment, the method includes that:

an n-type bismuth telluride sample and a p-type bismuth telluride sample of which the diameter is 30 mm and the length is 50 mm are separately manufactured by a zone melting method, and are used for manufacturing the thermoelectric arms in the subsequent steps.

The machined samples are cut by wire-electrode cutting to obtain the thermoelectric sheets with the thickness of 4 mm. Then the thermoelectric sheets after wire-electrode cutting are ultrasonically cleaned in anhydrous ethanol to clean the surfaces of the thermoelectric sheets.

The sheets obtained by cutting are bonded by the high-temperature-resistant epoxy AB glue: firstly a layer of thin glue is brushed on the sheets to completely cover the surfaces of the thermoelectric sheets, then the thermoelectric sheets stand for curing for 2-4 hours at normal temperature to cover the surfaces of the thermoelectric sheets with glue, and reliable insulation is achieved. Glue is brushed on the thermoelectric sheets with insulating surfaces, the thermoelectric sheets are sequentially bonded to obtain a five-layer structure of the thermoelectric sheets with the sequence of n-p-n-p-n, and the thermoelectric sheets stand for curing for 12-24 hours at normal temperature.

The five-layer structure of the bonded thermoelectric sheets is cut into strips with the sectional area of 4*6 mm$^2$ by wire-electrode cutting, and each strip contains five thermoelectric arms with the size of 4*4*6 mm$^3$. The strips obtained by cutting are bonded by the high-temperature-resistant epoxy AB glue are bonded: firstly a layer of thin glue is brushed on the side faces of the strips to completely cover the side faces of the thermoelectric strips, the thermoelectric strips stand for curing for 2-4 hours at normal temperature to cover the side faces of the thermoelectric strips with glue, and reliable insulation is achieved. Glue is brushed on the thermoelectric strips with insulating side faces, the thermoelectric strips are bonded in a staggered manner to obtain a structure which stands for curing for 12-24 hours at normal temperature. After curing is completed, redundant thermoelectric arms on two sides are cut off by wire-electrode cutting to obtain the thermoelectric arm blocks as the core part of the present disclosure.

The two faces of the bonded thermoelectric arm blocks are sputtered with nickel in a magnetron sputtering mode, and the specific process is as follows: 2500 #adhesive paper is used for polishing the surfaces of the thermoelectric arm blocks, then the thermoelectric arm blocks are placed in anhydrous ethanol to be ultrasonically cleaned, and after air-drying, the thermoelectric arm blocks are fixed to a sample table of a sputtering chamber. Air in the sputtering chamber is exhausted till the base pressure reaches $7*10^{-4}$ Pa. Then high-purity Ar gas is introduced, flow velocity is 30 sccm, the vacuum degree of the sputtering chamber is controlled to 1.5 Pa, Ni target is sputtered for 15 min at radio-frequency power of 120 W, and a sample is taken out after sputtering is completed. The sample is fixed again, the face which is not sputtered is fixed to the sample table of the sputtering chamber in a manner of facing a target material, and the sputtering process is repeated to obtain the thermoelectric arm blocks of which the two faces are covered with nickel.

Gaps of the thermoelectric arm blocks are grooved by wire-electrode cutting, the width of the grooves is 0.35 mm, the depth of the grooves is 0.5 mm, and thus, insulation between the different thermoelectric arms is achieved.

The copper sheets with the size of 3.3*7.3*0.6 mm$^3$ are obtained by machining in a laser cutting manner, and the surfaces of the copper sheets are plated with silver by using a chemical method.

The copper sheets are placed into the positioning grooves of the lower substrate 8 and the upper substrate 10 of the mold by using a high-temperature heat-conducting double sided adhesive tape, and solder paste with the thickness of 0.15 mm and the melting point is 217 degree centigrade is printed on the surfaces of the flow deflectors by using the silk screen printing table. The mold is assembled in the order of the bottom plate 7, the lower substrate 8, the thermoelectric arm positioning frame 9 for positioning the thermoelectric arms, the upper substrate 10, the lower top plate 11a, the spring and the upper top plate 11b, and M4 half-thread screws with the length of 45 mm pass through the positioning holes for positioning.

The whole mold is placed into a reflow oven for heating welding, the welding temperature is 260 degrees centigrade, the heating time lasts for 15 minutes, and the thermoelectric device of the present disclosure is taken out after welding is completed.

Figure 10:
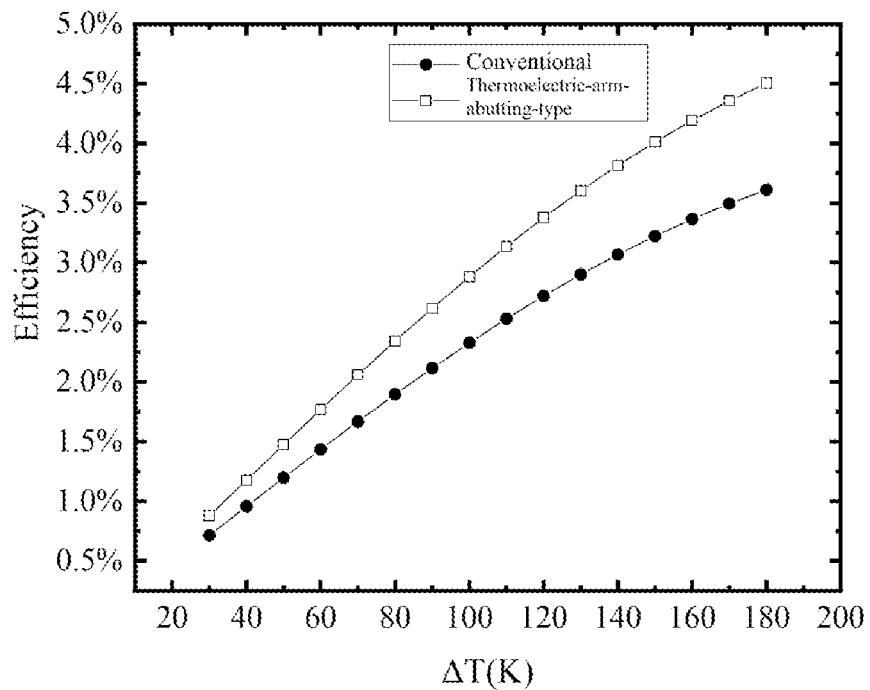
FIG. 10 is a simulation result of the efficiency of a thermoelectric power generation device.
Figure 11:
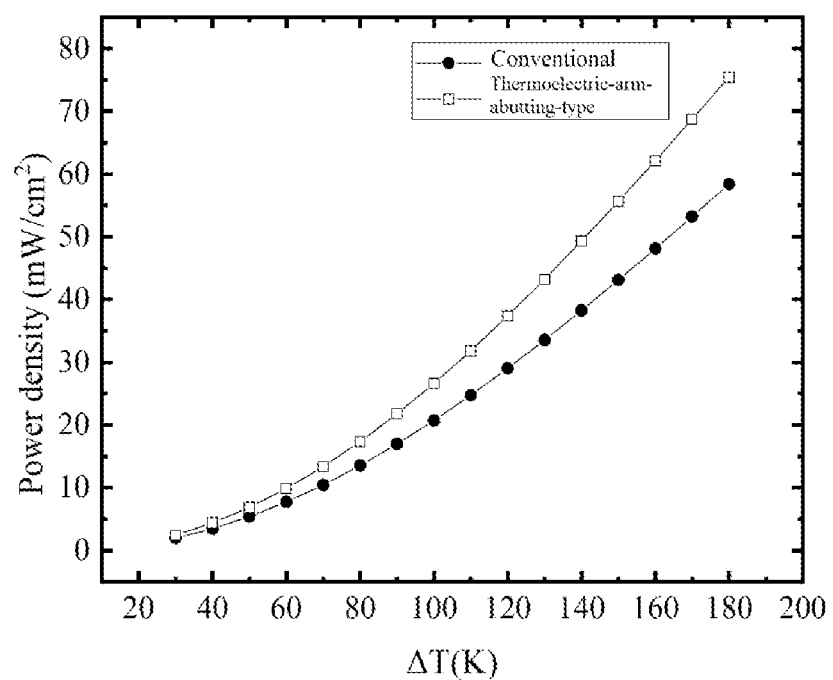
FIG. 11 is a simulation result of the power density of the thermoelectric power generation device.

The present disclosure is advantageous in that it has high power density and high efficiency. The thermoelectric-arm-abutting-type device of the present disclosure is simulated by using comsol software while in contrast to a conventional thermoelectric power generation device of which the size of thermoelectric arms is consistent with that of thermoelectric arms of the thermoelectric-arm-abutting-type device, and the duty cycle (duty cycle=total area of thermoelectric arms/total area of the thermoelectric power generation device) is 60%. During simulation, the temperature of the cold end of the thermoelectric power generation device is set to 0° C., the temperature of the hot end is set at intervals of 15° C. from 25-180° C., and when loads are matched, namely the load resistance is the same as the internal resistance of the device, the efficiencies and the power densities of the two devices are compared under the condition that the device has the highest output power. The simulation results are shown in FIG. 10 and FIG. 11, in which the abscissa represents the temperature difference between the two ends of the device, and the ordinate represents the efficiency and the power density respectively. Compared with the conventional thermoelectric power generation device, the efficiency and the power density of the present disclosure are improved by about 30%. Compared with the conventional device, the device disclosed by the present disclosure can achieve high power output under the condition of the same area due to higher power density, and the practical application of the device disclosed by the present disclosure to a thermoelectric power generation system is more advantageous due to higher efficiency.

Finally, it should be noted that the embodiments described are only a few embodiments of the present application, not all embodiments, and all other embodiments that can be obtained by one skilled in the art without making any inventive effort based on the embodiments in the present application fall within the scope of protection of the present application.

While certain exemplary embodiments of the present disclosure have been described above by way of illustration only, undoubtedly, those of ordinary skill in the art can make modification to the described embodiments in various different ways without departing from the spirit and scope of the present disclosure. Accordingly, the drawings and description are illustrative in nature and are not to be construed as limiting the scope of protection of claims of the present disclosure.

What is claimed is:

1. A thermoelectric device, comprising at least one thermoelectric arm unit, wherein the thermoelectric arm unit comprises:
   a first thermoelectric arm, provided with a first upper surface, a first lower surface opposite to the first upper surface, a first upper left corner cutout, a first upper right corner cutout, a first lower left corner cutout and a first lower right corner cutout;
   a second thermoelectric arm, provided with a second upper surface, second lower surface opposite to the second upper surface, a second upper left corner cutout, a second upper right corner cutout, a second lower left corner cutout and a second lower right corner cutout, wherein the second thermoelectric arm is bonded with the first thermoelectric arm via an insulating adhesive layer so that the first and second thermoelectric arms abut against together without an air gap existing therebetween, the first upper surface is flush with the second upper surface, a first spacing groove forming an upward first opening-perpendicular to first upper surface and the second upper surface and is formed between adjacent positions of the first upper surface and the second upper surface, the first lower surface is flush with the second lower surface, and a second spacing groove forming a downward second opening aligned with the first upward opening, perpendicular to first lower surface and the second lower surface; and opposite to the first upward opening and is formed between adjacent positions of the first lower surface and the second lower surface, the first upper right corner cutout and the second upper left corner cutout forms a portion of the first spacing groove, and the first lower right cutout and the second lower left corner cutout forms a portion of the second spacing groove;
   a first upper barrier layer, laminated on the first upper surface;
   a second upper barrier layer, laminated on the second upper surface;
   an upper flow deflector, laminated on the first upper barrier layer and the second upper barrier layer;
   a first lower barrier layer, laminated on the first lower surface;
   a second lower barrier layer, laminated on the second lower surface;
   a first lower flow deflector, laminated on the first lower barrier layer;
   a second lower flow deflector, laminated on the second lower barrier layer;
   an upper heat-conducting insulating layer, laminated on the upper flow deflector;
   a first lower heat-conducting insulating layer, laminated on the bottom face of the first lower flow deflector;
   a second lower heat-conducting insulating layer is laminated on the bottom face of the second lower flow deflector, wherein the upper heat-conducting insulating layer, the first and second heat-conducting insulating layers are made of heat-conducting silica gel;
   the first upward opening is extended to the upper flow deflector; and the second downward opening penetrates through the first lower flow deflector, the second lower flow deflector, a first lower heat-conducting insulating layer, and a second lower heat-conducting insulating layer; and
   the upper flow deflector is in direct contact with a cooling apparatus, and the first lower flow deflector and the second lower flow deflector are both in direct contact with a heat source, or the upper flow deflector is in direct contact with the heat source, and the first lower flow deflector and the second lower flow deflector are both in direct contact with the cooling apparatus.

2. The thermoelectric device according to claim 1, wherein the first thermoelectric arm is symmetric to the second thermoelectric arm about the insulating adhesive layer.

3. The thermoelectric device according to claim 2, wherein the insulating adhesive layer comprises epoxy AB glue; the first thermoelectric arm is a p-type thermoelectric piece and the second thermoelectric arm is an n-type thermoelectric piece, or the first thermoelectric arm is an n-type thermoelectric piece and the second thermoelectric arm is a p-type thermoelectric piece.

4. The thermoelectric device according to claim 3, wherein
   the lengths and widths of the first thermoelectric arm and the second thermoelectric arm are both equal and are 2.5-6 mm, the heights of the first thermoelectric arm and the second thermoelectric arm are both 2.5-10 mm, the depths of the first spacing groove and the second spacing groove are both 0.3-0.5 mm, and the widths of the first spacing groove and the second spacing groove are both 0.35-0.7 mm;
   the upper flow deflector, the first lower flow deflector and the second lower deflector are copper sheets with a thickness of 0.2-1 mm, and the copper sheet is plated with a silver layer with a thickness of 1-5 μm;
   the first lower barrier layer, the second upper barrier layer and the second lower barrier layer are nickel layers with a thickness of 1-5 μm.

5. A manufacturing mold for manufacturing the thermoelectric device according to claim 1, comprising:
   a bottom plate, provided with a horizontal supporting surface, wherein a plurality of first positioning holes are formed in the periphery of the supporting surface;
   a lower substrate, supported on the supporting surface, wherein the lower substrate is provided with equally spaced lower electrode positioning grooves to position the first lower flow deflector and/or the second lower flow deflector, a through hole is formed in the center of the lower electrode positioning groove, and a plurality of second positioning holes aligned to the first positioning holes are formed in the periphery of the lower substrate;
   a thermoelectric arm positioning frame, supported on the lower substrate, wherein the thermoelectric arm positioning frame comprises a hollow portion arranged in the center and configured to position the first thermoelectric arm provided with the first upper barrier layer and the first lower barrier layer and/or the second thermoelectric arm provided with the second upper barrier layer and the second lower barrier layer, and a plurality of third positioning holes formed in the periphery and aligned to the second positioning holes;
   an upper substrate, supported on the thermoelectric arm positioning frame, wherein the upper substrate is provided with equally spaced upper electrode positioning grooves to position the upper flow deflector, a through hole is formed in the center of the upper electrode positioning groove, a plurality of fourth positioning holes aligned to the third positioning holes are formed in the periphery of the upper substrate, and the upper electrode positioning grooves cooperate with the lower electrode positioning grooves to connect the thermoelectric arm unit in series;

a lower top plate, supported on the upper substrate, wherein the lower top plate comprises a lower mounting groove formed in the middle and configured for a spring to be embedded, and a plurality of fifth positioning holes formed in the periphery and aligned to the fourth positioning holes; and an upper top plate, supported on the lower top plate, wherein the upper top plate comprises an upper mounting groove formed in the middle and configured for the spring to be embedded, and a plurality of sixth positioning holes formed in the periphery and aligned to the fifth positioning holes, the upper mounting groove cooperates with the lower mounting groove to position the spring, and the first positioning holes, the second positioning holes, the third positioning holes, the fourth positioning holes, the fifth positioning holes and the sixth positioning holes are connected via fasteners.

6. A method for manufacturing the thermoelectric device by using the manufacturing mold according to claim 5, comprising the following steps:

carrying out wire-electrode cutting on an n-type bismuth telluride sample and a p-type bismuth telluride sample to obtain thermoelectric sheets, and bonding the thermoelectric sheets via an insulating adhesive layer to obtain the first thermoelectric arm and the second thermoelectric arm which are connected;

carrying out magnetron sputtering, electroplating or ionic spraying on the first thermoelectric arm and the second thermoelectric arm to form the first upper barrier layer and the first lower barrier layer on the first thermoelectric arm and form the second upper barrier layer and the second lower barrier layer on the second thermoelectric arm;

carrying out wire-electrode cutting on the first thermoelectric arm and the second thermoelectric arm to form the first spacing groove and the second spacing groove; and placing the upper flow deflector into the upper electrode positioning grooves, placing the first lower flow deflector and the second flow deflector into the lower electrode positioning grooves, carrying out silk screen printing on the upper flow deflector, the first lower flow deflector and the second lower flow deflector with solder paste separately, positioning the first thermoelectric arm and the second thermoelectric arm by using the thermoelectric arm positioning frame, connecting the first positioning holes, the second positioning holes, the third positioning holes, the fourth positioning holes, the fifth positioning holes and the sixth positioning holes via the fasteners to assemble the manufacturing mold, and placing the manufacturing mold into a reflow oven to carry out heating welding to form the thermoelectric device.

7. The manufacturing mold for manufacturing the thermoelectric device according claim 5, wherein the upper heat-conducting insulating layer is laminated on the upper flow deflector, the first lower heat-conducting insulating layer is laminated on the bottom face of the first lower flow deflector, and the second lower heat-conducting insulating layer is laminated on the bottom face of the second lower flow deflector.

8. The manufacturing mold for manufacturing the thermoelectric device according claim 5, wherein the upper flow deflector is in direct contact with a cooling apparatus, and the first lower flow deflector and the second lower flow deflector are both in direct contact with the heat source, or the upper flow deflector is in direct contact with a heat source, and the first lower flow deflector and the second lower flow deflector are both in direct contact with the cooling apparatus.

9. The manufacturing mold for manufacturing the thermoelectric device according claim 5, wherein the first thermoelectric arm is symmetric to the second thermoelectric arm about the insulating adhesive layer.

10. The manufacturing mold for manufacturing the thermoelectric device according claim 5, wherein the insulating adhesive layer comprises epoxy AB glue; the first thermoelectric arm is the p-type thermoelectric piece and the second thermoelectric arm is the n-type thermoelectric piece, or the first thermoelectric arm is the n-type thermoelectric piece and the second thermoelectric arm is the p-type thermoelectric piece.

11. The manufacturing mold for manufacturing the thermoelectric device according claim 5, wherein the lengths and widths of the first thermoelectric arm and the second thermoelectric arm are both equal and are 2.5-6 mm, the heights of the first thermoelectric arm and the second thermoelectric arm are both 2.5-10 mm, the depths of the first spacing groove and the second spacing groove are both 0.3-0.5 mm, and the widths of the first spacing groove and the second spacing groove are both 0.35-0.7 mm.

12. The manufacturing mold for manufacturing the thermoelectric device according claim 11, wherein the upper flow deflector, the first lower flow deflector and/or the second lower deflector are copper sheets with thicknesses of 0.2-1 mm, and the copper sheet is plated with a silver layer with a thickness of 1-5 μm.

13. The manufacturing mold for manufacturing the thermoelectric device according claim 11, wherein the first upper barrier layer, the first lower barrier layer, the second upper barrier layer and/or the second lower barrier layer are nickel layers with thicknesses of 1-5 μm.

* * * * *